United States Patent [19]

Bruel

[11] Patent Number: 5,559,043
[45] Date of Patent: Sep. 24, 1996

[54] METHOD FOR PLACING SEMICONDUCTIVE PLATES ON A SUPPORT

[75] Inventor: Michel Bruel, Veurey, France

[73] Assignee: Commissariat a l'Energie Atomique, Paris, France

[21] Appl. No.: 378,455

[22] Filed: Jan. 25, 1995

[30] Foreign Application Priority Data

Jan. 26, 1994 [FR] France .................... 94 00836

[51] Int. Cl.⁶ .................................... H01L 21/266
[52] U.S. Cl. ...................... 437/24; 437/974; 437/173
[58] Field of Search .................... 437/24, 26, 966, 437/173, 937, 974; 148/DIG. 12

[56] References Cited

U.S. PATENT DOCUMENTS

| | | |
|---|---|---|
| 4,368,083 | 1/1983 | Bruel et al. . |
| 4,452,644 | 6/1984 | Bruel et al. . |
| 4,837,172 | 6/1989 | Mizumo et al. ............ 437/24 |
| 5,082,793 | 1/1992 | Li ............................. 437/26 |
| 5,198,371 | 3/1993 | Li ............................. 437/24 |
| 5,304,509 | 4/1994 | Sopori ....................... 437/173 |
| 5,374,564 | 12/1994 | Bruel ......................... 437/24 |
| 5,376,560 | 12/1994 | Aronowitz et al. ........ 437/24 |
| 5,494,835 | 2/1996 | Bruel ......................... 437/974 |

FOREIGN PATENT DOCUMENTS 0533551  3/1993  European Pat. Off. .

OTHER PUBLICATIONS

Patent Abstracts of Japan, vol. 7, No. 107 (E–174), May 11, 1993, JP–58–030145, Feb. 22, 1983.

Primary Examiner—George Fourson
Assistant Examiner—S. Mulpuri
Attorney, Agent, or Firm—Oblon, Spivak, McClelland, Maier & Neustadt, P.C.

[57] ABSTRACT

Method for laying at least one semiconductive plate with a specific thickness and size on a support, wherein it includes the following stages: the bombardment by ions of one face of a semiconductive substrate so as to create there a film of gaseous microbubbles along a splitting plane of the substrate, the ion implantation energy being provided so as to obtain the film of gaseous microbubbles at a depth corresponding to the specific thickness of the semiconductive plate, the ions being selected from rare gas or hydrogen gas ions, the rendering integral on the face of the substrate of the support, illuminating by a laser beam of the zone of the face of the substrate corresponding to the plate to be placed through the support, the luminous energy transmitted by the beam through the support needing to be sufficient so as to induce in the corresponding region of the film of gaseous microbubbles a temperature sufficient to cause splitting of the plate of the support and provoke increasing of the adherence of the plate on the support, separating the substrate with respect to the support, this separation separating the plate from the substrate and retaining it on the support.

10 Claims, 2 Drawing Sheets

METHOD FOR PLACING SEMICONDUCTIVE PLATES ON A SUPPORT

FIELD OF THE INVENTION

The present invention concerns a method for placing one or several semiconductive plates on a support and in particular on a nonconducting support.

BACKGROUND OF THE INVENTION

In a large number of electronic control devices, semiconductive components are placed having with a restricted surface with respect to the surface of the element supporting them. This is thus the case with, for example, active matrix flat display screens where each image element of the screen (or pixel) is controlled by a transistor. The techniques currently employed for this type of device use hydrogenated amorphous silicon or polycrystalline silicon for the production of transistors to control the pixels.

During the production of these transistors, the entire surface of the support on which the pixels are shaped is covered with a film of an amorphous semiconductive or, depending on the case, a polycrystalline material. Then the largest portion of this film is etched so as to only leave the zones reserved for the transistors. The surface occupied by the control transistors merely represents a small portion of the surface of the pixel (less than 20%). An effort is being made to reduce this parasitic occupation and those of interconnections so that the luminous transmission loss of the screen is minimal.

This traditional method for producing pixel control transistors thus provokes the dissipation of the major part of the initially placed silicon film. Up until now, a lot of importance has not been attached to this occurence because the cost of placing of an amorphous silicon or polycrystalline film is low. This is no longer the case if it is desired to use a superior quality semiconductive material and in particular monocrystalline silicon. This case of dissipating the major part of the silicon film thus constitutes a serious drawback.

SUMMARY OF THE INVENTION

The present invention is able to resolve this problem. It offers the possibility of placing a semiconductive material, especially monocrystalline silicon, in the form of small plates placed exactly at the locations required and whose surface is exactly sufficient for the embodiment of the devices. Thus, a technically high performance method is obtained since it allows for the use of monocrystalline silicon proving to be less expensive as a small amount of silicon is used. In addition, this method is applicable to large surface active matrix screens.

The method of the present invention makes use of a technique derived from the information contained in the document FR-A-2 681 472. This document discloses a method for producing thin films made of a semiconductive material and includes three stages. In the first stage, a film of gaseous microbubbles is implanted under one face of a plate made of a semiconductive material by means of ionic bombardment. In the second stage, the face of the plate is rendered integral with a stiffener. In the third stage, the unit constituted by the plate and the stiffener is subjected to a sufficient temperature so as to create, via a crystalline rearrangement in the plate and pressure effect in the microbubbles, a splitting of the plate at the level of the film of the microbubbles. Thus, a thin film adhering to the stiffener is obtained.

Thus, the object of the invention is to provide a method for placing on a support at least one semiconductive plate having a specific size and thickness, wherein it includes the following stages:

bombardment by ions of one face of a semiconductive substrate so as to create there a film of gaseous microbubbles along a splitting plane of the substrate, ion implantation energy being provided so as to obtain the film of gaseous microbubbles at a depth corresponding to the specific thickness of the semiconductive plate, the ions being selected from rare gas or hydrogen gas ions, rendering integral on said face of the substrate of the support, illuminating by a laser beam of the zone of the face of the substrate corresponding to the plate to be placed through the support, the luminous energy transmitted by the beam through said support needing to be sufficient so as to induce in the corresponding region of the film of gaseous microbubbles a temperature sufficient to cause splitting of the plate of the support and provoke increasing the adherence of the plate on the support, separating the substrate with respect to the support, this separation separating the plate from the substrate and retaining it on the support.

"Rendering integral" is understood to be any operation between the substrate and the support able to provide a sufficient linking energy between these two elements so that they remain together during subsequent operations. For example, these operations may be surface treatment operations able to generate inter-atomic links, glueing operations, etc. Moreover, the notion of separation includes any separation operation, such as one exerting traction.

The method may advantageously comprise, prior to or subsequent to the bombardment stage, a stage for etching said face of the substrate by trenches delimiting on the face of the substrate a surface corresponding to the size of said plate.

The depth of the trenches is preferably greater than the depth of the film of gaseous microbubbles.

If the substrate is intended to provide several plates on the support, the illumination of the zones of the face of the substrate corresponding to the plate to be placed may be obtained by scanning the substrate by the luminous beam or may be effected collectively by illumination through a mask pierced with openings corresponding to the zones to be illuminated.

BRIEF DESCRIPTION OF THE DRAWINGS

The invention and other advantages and its features shall be more readily understood from a reading of the following description given by way of non-restrictive example accompanied by the annexed drawings on which.

DETAILED DESCRIPTION OF THE PREFERRED EMBODIMENTS

By way of embodiment example, the rest of the description shall concern the placing of a set of semiconductive monocrystalline silicon plates on a glass support intended to form part of the constitution of a flat active matrix display screen.

Figure 1:
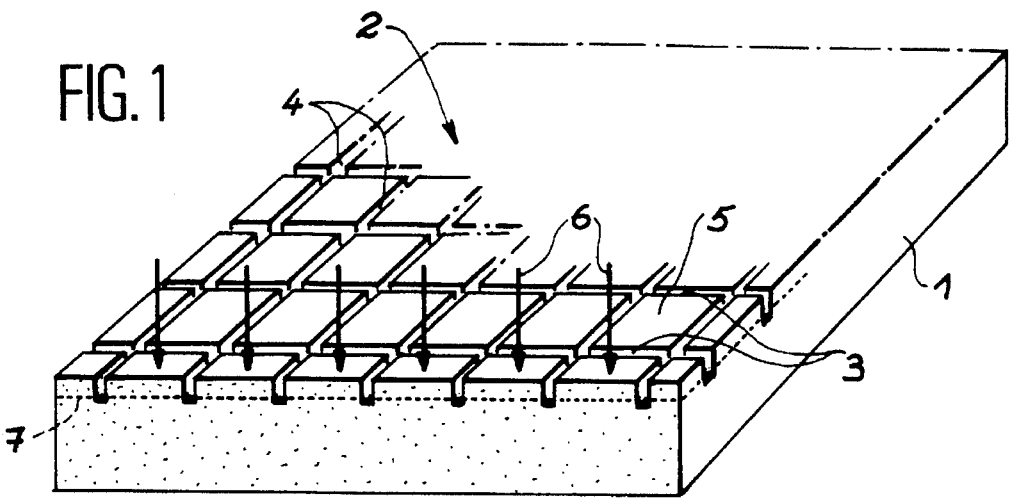
FIG. 1 shows a semiconductive substrate during the ionic bombardment stage in accordance with the placing method of the invention.

FIG. 1 shows a monocrystalline substrate 1 made of monocrystaline silicon used as a source of small thin plates intended to be transferred onto the glass support of the flat screen. The plates may have a surface of between about 10 and 40 µm sideways and a thickness of about one µm. They may be distributed regularly on the surface of the glass support along two orthogonal directions X and Y with a pitch of between 100 and 1000 µm.

So as to facilitate the separation of the semiconductive plates from the rest of the substrate, the face 2 of the substrate to be submitted to the method of the invention may be etched with trenches 3 plotted along a first direction cutting trenches 4 plotted along a second direction perpendicular to the first. These trenches 3 and 4 may have a width of 3 µm for a depth of 2 µm. They square out the surface of the substrate 1 and collectively delimit zones given the reference 5 on FIG. 1 with a surface corresponding to that of the plates desired.

The trenches 3 and 4 are not obligatory but do facilitate the separation of the plates from their substrate and can fully delimit the size of these plates. They may also be embodied both prior to and after the ion implantation stage.

The face 2 of the semiconductive substrate 1 is then subjected to an implantation stage by bombarding this face with hydrogen ions (protons or $H_2$ +) bearing the general reference 6 with an energy as a function of the thickness of the desired plate. By way of example, it is possible to bombard the substrate 1 with protons with an energy of 100 keV which corresponds to a thickness of about 800 angstroms. The dose of protons during the bombardment is about $5 \cdot 10^{16}$ protons/cm2 and the temperature of the substrate during the implantation stage is kept between 150° C and 350° C.

It is also possible to use rare gas ions instead of hydrogen ions as disclosed in U.S. Pat. No. 5,374,564.

The embodiment of the implantation of ions generates a film of gaseous microbubbles 7 under the face 2 of the semiconductive substrate 1. At the time of preparing the substrate, the depth of the trenches 3 and 4 has been provided so as to be greater than the depth of the film of gaseous microbubbles.

Then the support, to which the semiconductive plates are to be secured, is applied to the face 2 of the semiconductive substrate. In this embodiment example, this support is made of glass. It is transparent to the luminous beam which shall be used in the continuation of the method. The substrate and the support are rendered integral structure by means of inter-atomic links.

Figure 2:
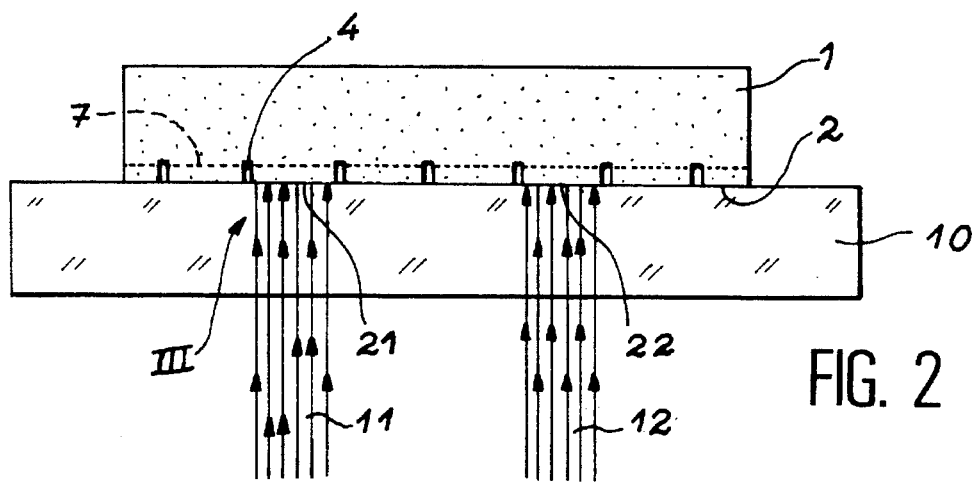
FIG. 2 illustrates the stage for illuminating the substrate so as to provoke the splitting of the plates of the semiconductive substrate and increase their adherence to a support in accordance with the placing method of the invention.

FIG. 2 shows this disposition where one can see the support 10. The zones of the semiconductive substrate 1 to be placed on this support are then selectively illuminated through the glass support 10. FIG. 2 thus respectively and successively shows two luminous beams 11 and 12 illuminating the zones 21 and 22 of the face 2 of the substrate. The illumination of these zones needs to satisfy the following criteria: density of the power absorbed in the silicon film subjected to this illumination and period of illumination so that the temperature of the illuminated surface rises adiabatically above 600° C. without the temperature of the neighbouring surfaces rising. This rise of temperature of the illuminated zones then induces a splitting at a depth corresponding to the depth of penetration of the hydrogen ions (that is at the level of the film of microbubbles) and the increase of the linking energy between these zones and the support by virtue of the increase of the energy of the inter-atomic links due to the rise of temperature.

Figure 3:
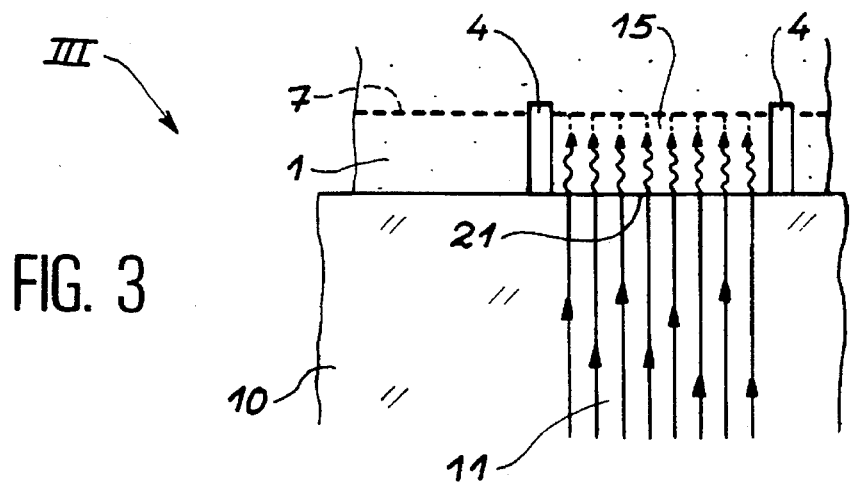
FIG. 3 is a detailed view of the substrate of FIG. 2.

FIG. 3, which is a detailed enlarged view of FIG. 2, shows by the wavy lines the propagation of the temperature rise towards the portion of the film of gaseous miocrobubbles 7 between the two trenches 4 for one of the illuminated zones.

Figure 4:
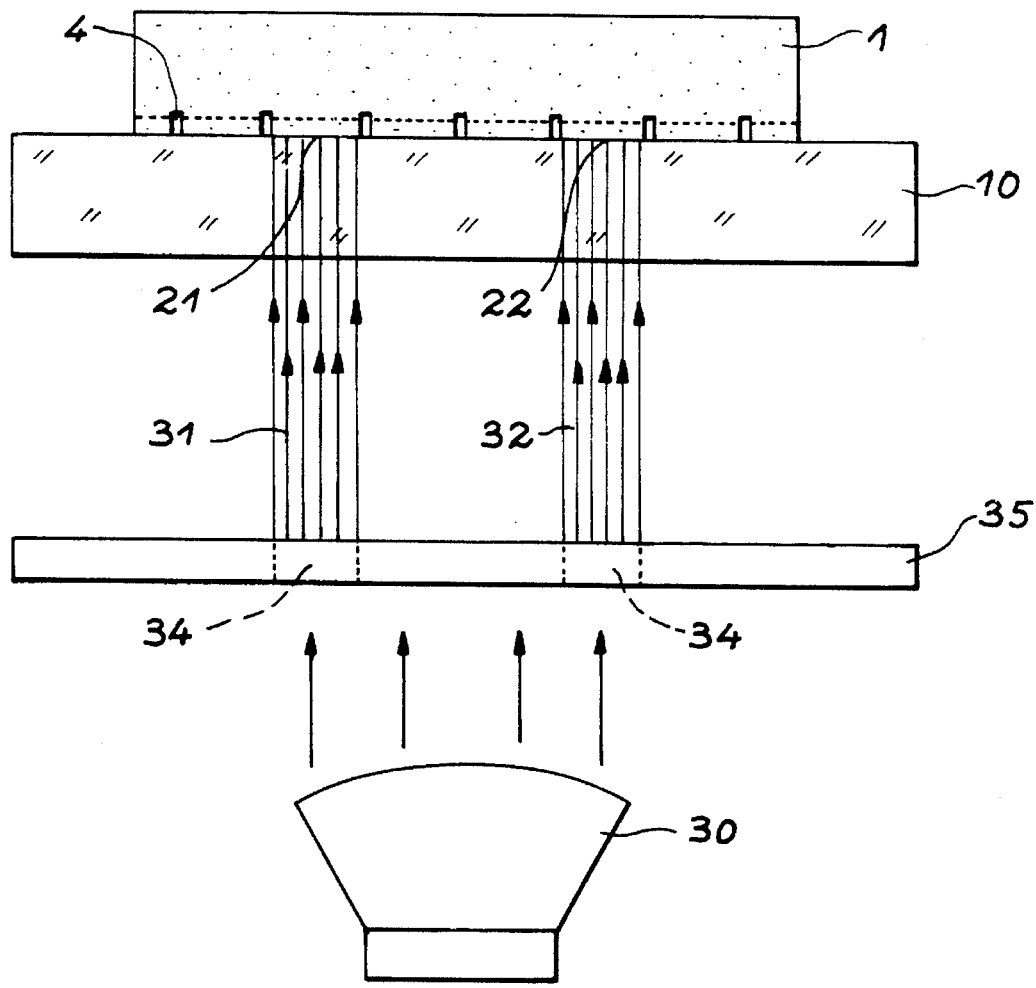
FIG. 4 shows a variant of the illumination stage in accordance with the placing method of the invention.

The luminous beams may be provided by a yag laser. By way of example, the luminous beam derived from the yag laser provoking the splitting of a plate and increasing its adherence to the support may have a pulse period of 30 ns and provide energy of between 0.2 and 0.4 J per pulse. Illumination may be effected by scanning so as to successively illuminate each plate to be placed. It may also be effected collectively to place all the plates simultaneously by using a mask. This is the case on FIG. 4 which shows the semiconductive substrate 1/glass support 10 of FIG. 2. This time, the zones 21 and 22 (the only ones represented) are simultaneously illuminated by luminous beams respectively 31 and 32 provided by a common light source 30 and passing through openings 34 of the mask 35. These openings 34 may be with surfaces equal to those of the plates to be obtained and distributed according to the same pitch.

Figure 5:
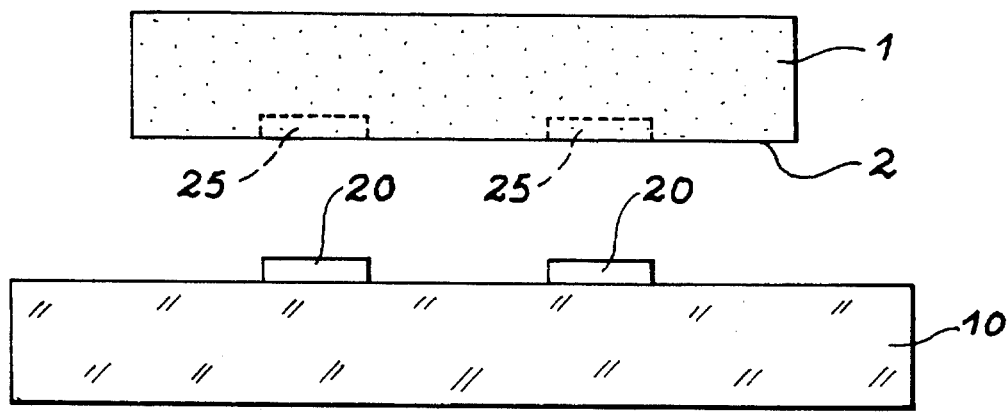
FIG. 5 shows the final stage for removing the substrate with respect to the support of the placing method of the invention.

The next stage shown on FIG. 5 consists of spacing the semiconductive substrate 1 and support 10 from each other. This is possible as the portions which have been illuminated are separated from the semiconductive substrate and because the linking energy is low in the non-illuminated portions since the temperature has not increased. Thus, a support 10 is obtained provided at the selected locations with semiconductive plates 20 adhering to the support. The transfer is thus effected, the face 2 of the substrate 1 having superficial recesses 25 corresponding to the transferred plates.

Although for the sake of simplification the figures have only shown the case of transfer of two semiconductive plates, it is obviously clear that the transfer may concern far more plates and in particular all the semiconductive plates required to embody an active matix flat screen.

After the transfer of a first set of plates, the semiconductive substrate may be used for the transfer of a second set of plates, then a third set, etc. This procedure may be continued until using up all the plates of a given surface if the semiconductive substrate has initially been implanted with ions uniformly over the entire transfer surface. After this, the appropriated face of the substrate may be repolished for a new application of the method of the invention.

The present invention may advantageously be applied for embodying image sensors and active matrix printing head sensors.

What is claimed is:

1. Method for placing at least one semiconductive plate having a specific size and thickness on a support and including the following stages:

the bombardment by ions of one face of a semiconductive substrate so as to create there a film of gaseous microbubbles along a splitting plane of the substrate, the ion implantation energy being provided so as to obtain the film of gaseous microbubbles at a depth corresponding to the specific thickness of the semiconductive plate, the ions being selected from rare gas or hydrogen gas ions, then rendering integral structure by applying a support on said face of the substrate, illuminating by a laser beam of a zone of the face of the substrate corresponding to the plate to be placed through the support, the luminous energy transmitted by the beam through said support needing to be sufficient so as to induce in the corresponding region of the film of gaseous microbubbles a temperature sufficient to cause splitting of the plate of the support and provoke increasing the adherence of the plate to the support, thereby separating the substrate with respect to the support, this separation separating the plate from the substrate and retaining it on the support.

2. Method according to claim 1 and comprising, prior to or subsequent to the bombardment stage, a stage for etching said face of the substrate by trenches delimiting on the face of the substrate a surface corresponding to the size of said plate.

3. Method according to claim 2, wherein the depth of the trenches is greater than the depth of the film of gaseous microbubbles.

4. Method according to claim 1, wherein, as the substrate is required to provide several plates on the support, the illumination of the zones of the face of the substrate corresponding to the plates to be placed is obtained by scanning the substrate with the luminous beam.

5. Method according to claim 1, wherein, as the substrate is needed to provide several plates on the support, the illumination of the zones of the face of the substrate corresponding to the plates to be placed is effected collectively by means of illumination through a mask pierced with openings corresponding to the zones to be illuminated.

6. Method according to claim 1, wherein the luminous beam is a yag beam.

7. Method according to claim 1, wherein the substrate is made of monocrystalline silicon and bombardment is carried out by hydrogen ions at a temperature of the substrate of between 150° C. and 350° C., the luminous beam raising the temperature of the zones of the illuminated substrate to more than 600° C.

8. Method according to claim 1, comprising placing a plurality of semiconductive plates for forming transistors for controlling the pixels of an active matrix flat screen therein.

9. Method according to claim 1, comprising placing a plurality of semiconductive plates for forming image sensors therein.

10. Method according to claim 1, comprising placing a plurality of semiconductive plates for forming active matrix printing heads therein.

* * * * *